United States Patent
Malocha et al.

(10) Patent No.: US 7,825,805 B2
(45) Date of Patent: Nov. 2, 2010

(54) DELAYED OFFSET MULTI-TRACK OFC SENSORS AND TAGS

(75) Inventors: Donald Malocha, Winter Springs, FL (US); Derek Puccio, Salt Lake City, UT (US)

(73) Assignee: University of Central Florida Research Foundation, Inc., Orlando, FL (US)

(*) Notice: Subject to any disclaimer, the term of this patent is extended or adjusted under 35 U.S.C. 154(b) by 939 days.

(21) Appl. No.: 11/703,377

(22) Filed: Feb. 7, 2007

(65) Prior Publication Data
US 2010/0066495 A1 Mar. 18, 2010

Related U.S. Application Data

(60) Provisional application No. 60/774,099, filed on Feb. 16, 2006.

(51) Int. Cl.
G08B 13/14 (2006.01)
H03H 9/00 (2006.01)
H04B 1/00 (2006.01)

(52) U.S. Cl. .............. 340/572.1; 340/572.2; 340/572.5; 340/572.7; 333/193; 333/195; 333/196; 375/151; 375/153

(58) Field of Classification Search ... 340/572.1–572.9, 340/573.1, 573.4, 10.1, 5.25, 5.7, 5.8; 235/375–385; 333/193–196; 375/151, 153; 370/320
See application file for complete search history.

(56) References Cited

U.S. PATENT DOCUMENTS

| | | | |
|---|---|---|---|
| 4,200,849 A | 4/1980 | Malocha | 333/194 |
| 4,737,790 A * | 4/1988 | Skeie et al. | 342/51 |
| 5,028,831 A | 7/1991 | Malocha et al. | 310/313 |
| 6,150,921 A * | 11/2000 | Werb et al. | 340/10.1 |
| 7,005,964 B2 * | 2/2006 | Edmonson et al. | 340/10.1 |
| 7,005,987 B2 * | 2/2006 | Sinnett et al. | 340/572.1 |
| 7,053,524 B2 * | 5/2006 | Edmonson et al. | 310/313 D |
| 7,105,980 B2 | 9/2006 | Abbott et al. | 310/313 |
| 7,132,778 B1 * | 11/2006 | Nysen et al. | 310/313 D |
| 2004/0036381 A1 | 2/2004 | Abbott et al. | 310/313 |
| 2006/0049714 A1 * | 3/2006 | Liu et al. | 310/313 R |

OTHER PUBLICATIONS

Malocha, D.C., Puccio, D., Gallagher, D., [online], retrieved on Aug. 17, 2006, "SAW Sensors Using Orthongonal Frequency Coding," (2004) IEEE International . . . , Publication, 4 pages, Retrieved from: http://www.caat.engr.ucf.edu/Publicaitons/SAW%20Sensors%20Orthogonal%20Frequency%20Coding.pdf.

(Continued)

*Primary Examiner*—Brian A Zimmerman
*Assistant Examiner*—Mark Rushing
(74) *Attorney, Agent, or Firm*—Brian S. Steinberger; Phyllis K. Wood; Law Offices of Brian S. Steinberger, P.A.

(57) ABSTRACT

Apparatus, systems, devices and methods for providing an orthogonal frequency coding technique for surface acoustic wave sensors incorporating the use of multiple parallel acoustic tracks to provide increased coding by phase shifting and delaying a code sequence. The surface acoustic wave sensor includes parallel tracks with multiple reflectors with differing delay offsets to form a complex code sequence. The reflectors may be uniform, but alternatively could include fingers withdrawn, have reflector position modulation, differing frequencies or be spatially weighted.

18 Claims, 9 Drawing Sheets

OTHER PUBLICATIONS

Malocha, D.C., Puccio, D., Gallagher, D., "Orthogonal Frequency Coding for SAW Device Applications," *Ultrasonics Symposium, (2004) IEEE*, vol. 2, Aug. 23-27, 2004, pp. 1082-1085, vol. 2, Digital Object Identifier 10.1109/ULTSYM.2004.1417965.

"Orthogonal Frequency Coding for SAW Tagging and Sensors," [Online] 1 page, [retrieved on Aug. 11, 2006] (2006) Inst. Of Electrical and Electronics Engineers, Abstract Only, Retrieved from: http://www.ieee-uffc.org/archive/uffc/trans/Toc/abs/06/t0620377.htm.

Puccio, D., Malocha, D.C., Saldanha, N., "Implementation of Orthogonal Frequency Coded SAW Devices Using Apodized Reflectors," *Frequency Control Symposium and Exposition, 2005, Proceedings of the 2005 IEEE International*, Aug. 29-31, 2005, pp. 892-896, Digital Object Identifier 10.1109/FREQ.2005.1574051.

S.E. Carter and D.C. Malocha, "SAW device implementation of a weighted stepped chirp code signal for direct sequence spread spectrum communication systems", IEEE Transactions on Ultrasonics, Ferroelectrics, and Frequency control, vol. 47, Jul. 2000, pp. 967-973.

T. Omori, J. Akasaka, M. Arai, K. Hashimoto, M. Yamaguchi, "Optimisation of weighted SAW grating reflectors with minimized time delay deviation," Proc. IEEE International Frequency Control Symposium and PDA Exhibition, 2001, pp. 666-670.

P.V. Wright, "Modeling and experimental measurements of the reflection properties of SAW metallic gratings," Proc. IEEE International Ultrasonics Symposium, 1984, pp. 54-63.

W.J. Tanski, "SAW resonators utilizing withdrawal weighted reflectors," IEEE Transactions on Sonics and Ultrasonics, vol. 26, No. 6, pp. 404-410, Nov. 1979.

P.D. White, R.F. Mitchell, R. Stevens, P. Moore, M. Redwood, "Synthesis and design of weighted reflector banks for SAW resonators," Proc. IEEE International Ultrasonics Symposium, 1978, pp. 634-638.

\* cited by examiner

DELAYED OFFSET MULTI-TRACK OFC SENSORS AND TAGS

This application claims the benefit of priority to U.S. Provisional Application No. 60/774,099 filed on Feb. 16, 2006.

FIELD OF THE INVENTION

This invention relates to orthogonal frequency coded surface acoustic wave sensors and, in particular, to apparatus, systems, devices and methods for generating, distributing, processing and detecting orthogonal frequency coding for surface acoustic wave and silicon tags and sensors for transmission of sensor identification and information using multiple parallel acoustic tracks to provide increased coding by phase shifting and delaying a code sequence.

BACKGROUND AND PRIOR ART

The surface acoustic wave (SAW) sensor offers advantages in that it is wireless, passive, small and has varying embodiments for different sensor applications. Surface acoustic wave (SAW) sensors are capable of measuring physical, chemical and biological variables and have the ability to operate in harsh environments. In addition, there are a variety of ways of encoding the sensed data information for retrieval. Single sensor systems can typically use a single carrier RF frequency and a simple device embodiment, since tagging is not required. In a multi-sensor environment, it is necessary to both identify the sensor as well as obtain the sensed information. The SAW sensor then becomes both a sensor and a tag and must transmit identification and sensor information simultaneously.

Known SAW devices include delay line and resonator-based oscillators, differential delay lines, and devices utilizing multiple reflective. Single sensor systems can typically use a single carrier frequency and a simple coding technique, since tagging is not required. However, there are advantages of using spread spectrum techniques for device interrogation and coding, such as enhanced processing gain and greater interrogation power.

The use of orthogonal frequencies for a wealth of communication and signal processing applications is well known to those skilled in the art. Orthogonal frequencies are often used in an M-ary frequency shift keying (FSK) system. There is a required relationship between the local, or basis set, frequencies and their bandwidths which meets the orthogonality condition. If adjacent time chips have contiguous local stepped frequencies, then a stepped chirp response is obtained as described in S. E. Carter and D. C. Malocha, "SAW device implementation of a weighted stepped chirp code signal for direct sequence spread spectrum communication systems", IEEE Transactions on Ultrasonics, Ferroelectrics, and Frequency control, Vol. 47, July 2000, pp. 967-973.

Other known SAW devices include delay line and resonator-based oscillators, differential delay lines, and devices utilizing multiple reflective structures where the reflector length determines a single chip length. The amplitude, phase and delay of each chip can be different from adjacent chips and the sum of all chips yield the code sequence. In this serial approach, the greater the number of code required, the longer the device.

SUMMARY OF THE INVENTION

A primary objective of the invention is to provide new apparatus, methods, systems and devices for generating, distributing, processing and detecting orthogonal frequency coding for surface acoustic wave and silicon tags and sensors for transmission of sensor identification and information using multiple parallel acoustic tracks to provide increased coding by phase shifting and delaying a code sequence.

A secondary objective of the invention is to provide new apparatus, methods, systems and devices with an increased amount of code information for each device without significantly increasing the size of the device.

A third objective of the invention is to provide new apparatus, methods, systems and devices for surface acoustic wave and silicon tags and sensors having a device length that is increased by approximately one chip while doubling the coding. The cost is a slightly wider device.

A fourth objective of the invention is to provide new apparatus, methods, systems and devices for surface acoustic wave and silicon tags and sensors wherein the amplitude, phase and delay of each chip is different from adjacent chips and the sum of all chips yields the code sequence in each track, and the sum of all parallel tracks yields the complete signal code sequence.

A first preferred embodiment of the invention provides an orthogonal frequency coded device that includes a substrate, a transducer and plural acoustic tracks each having a bank of reflectors fabricated on the substrate. The plural acoustic tracks are coupled with the transducer and each acoustic track produces a different code sequence with a different delay between a starting chip sequence in each of the different code sequences. The sum of the different code sequences forms an orthogonal coded signal for the device to provide increased coding by including delays in the code sequences.

Each of the banks of reflectors includes a first and second bank of reflectors located on opposite sides of said transducer and coupled with the transducer. Each bank of reflectors includes plural reflectors coupled together each producing an orthogonal frequency within a bandwidth to generate the code sequence for a corresponding one of the plural tracks. A summation of the codes sequences from the plural tracks produces the orthogonal coded signal for the device.

A second embodiment provides a method for producing an orthogonal frequency coded device that includes the steps of providing a substrate, fabricating a transducer fabricating plural acoustic tracks each having a bank of reflectors on said substrate. Each of the reflectors in the bank of reflectors produces a different orthogonal frequency in a bandwidth, the sum of the different orthogonal frequencies is a different code sequence for the track. The plural acoustic tracks are coupled with the transducer and a starting chip sequence in each track is delayed to produce a different code sequence from each of the plural tracks. The different code sequences are summed together to produce an orthogonal code signal for the device.

Fabricating each plural acoustic track includes fabricating a first and second bank of reflectors on opposite sides of the transducer and include plural adjacent reflectors, each producing a different one of a contiguous orthogonal frequency within a bandwidth. The plural reflector are coupled together and the sum the different orthogonal frequencies from the plural adjacent reflectors to produce the code sequence for the track.

Other embodiments include phase shifting the different orthogonal frequencies to increase coding or delaying the different orthogonal frequency from adjacent reflectors, wherein the sum of the different orthogonal frequencies from adjacent reflectors yields the code sequence for the corresponding track.

DESCRIPTION OF THE PREFERRED EMBODIMENTS

Figure 1:
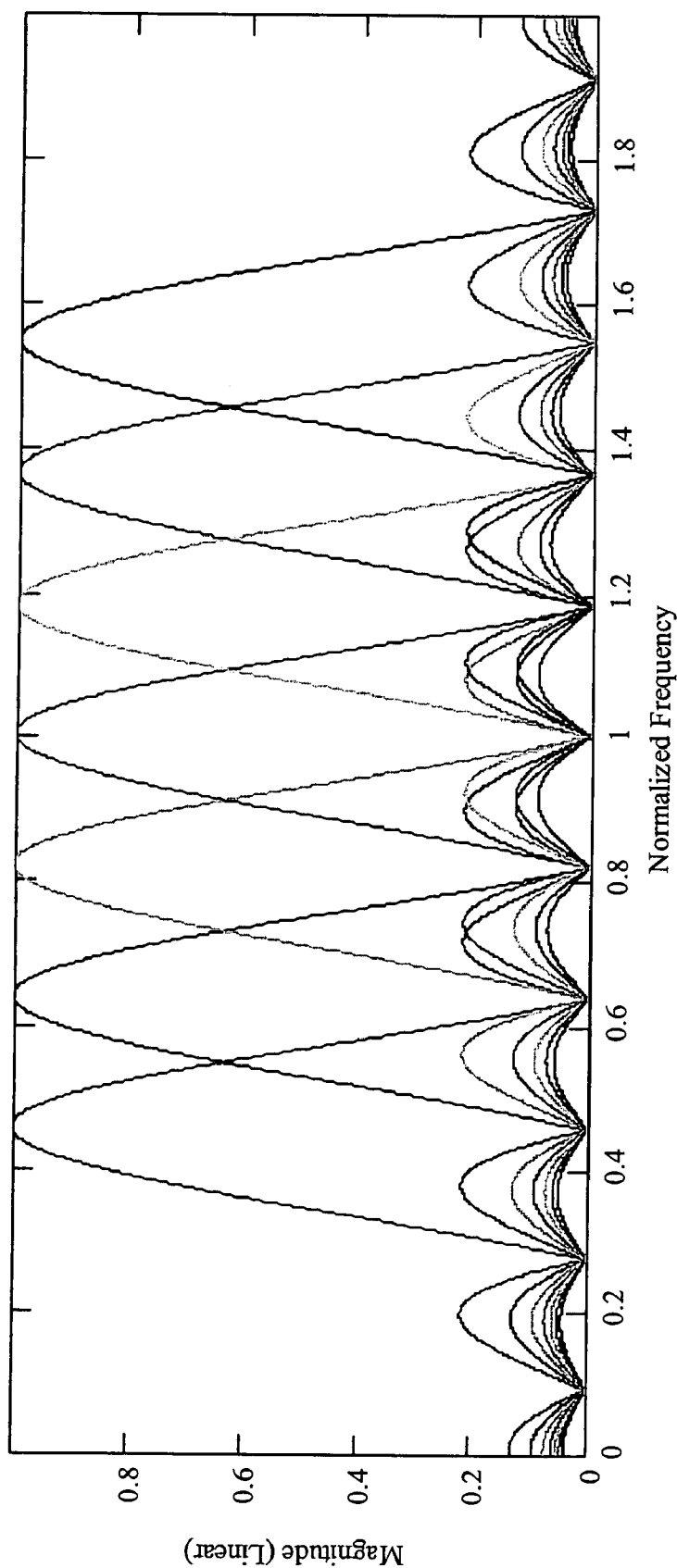
FIG. 1 is an example of a stepped chirp response.

Before explaining the disclosed embodiments of the present invention in detail it is to be understood that the invention is not limited in its application to the details of the particular arrangements shown since the invention is capable of other embodiments. Also, the terminology used herein is for the purpose of description and not of limitation.

The following is a list of the reference numbers used in the drawings and the detailed specification to identify components:

200 OFC SAW system
210 tag
220 up-chirp
230 tag impulse response
240 down-chirp
300 multi-track SAW device
310 transducer
320 left bank of reflectors
325 right bank of reflectors
330 left bank of reflectors
335 right bank of reflectors
340 left bank of reflectors
345 right bank of reflectors It would be useful to review orthogonal frequency before discussing the method, system apparatus and device for using orthogonal frequency coding of the present invention. Orthogonal frequencies are used to spread the signal bandwidth. The orthogonality condition describes a relationship between the local chip frequencies and their bandwidths. As an example, consider the stepped linear chirp shown in FIG. 1. Seven coherent carriers are used to generate the signal shown. Each chip contains an integer number of carrier half cycles due to the orthogonality condition. Under these conditions, the resulting waveform is continuous. The conditions, however, do not require that the local frequency of adjacent chips, that are contiguous in time, be contiguous in frequency. Instead, the time function of a bit provides a level of frequency coding by allowing a shuffling of the chip frequencies in time.

Figure 2:
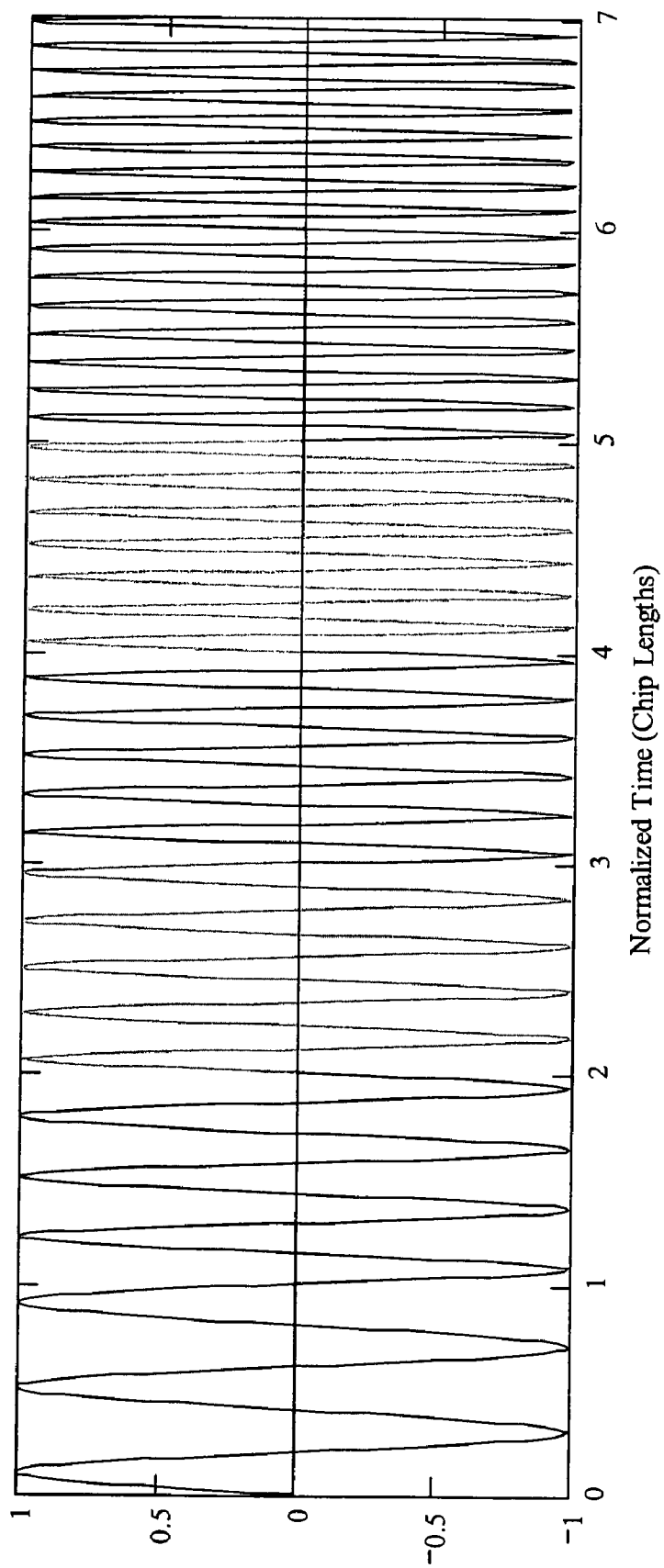
FIG. 2 is an example of an OFC chip frequency response.
Figure 3:
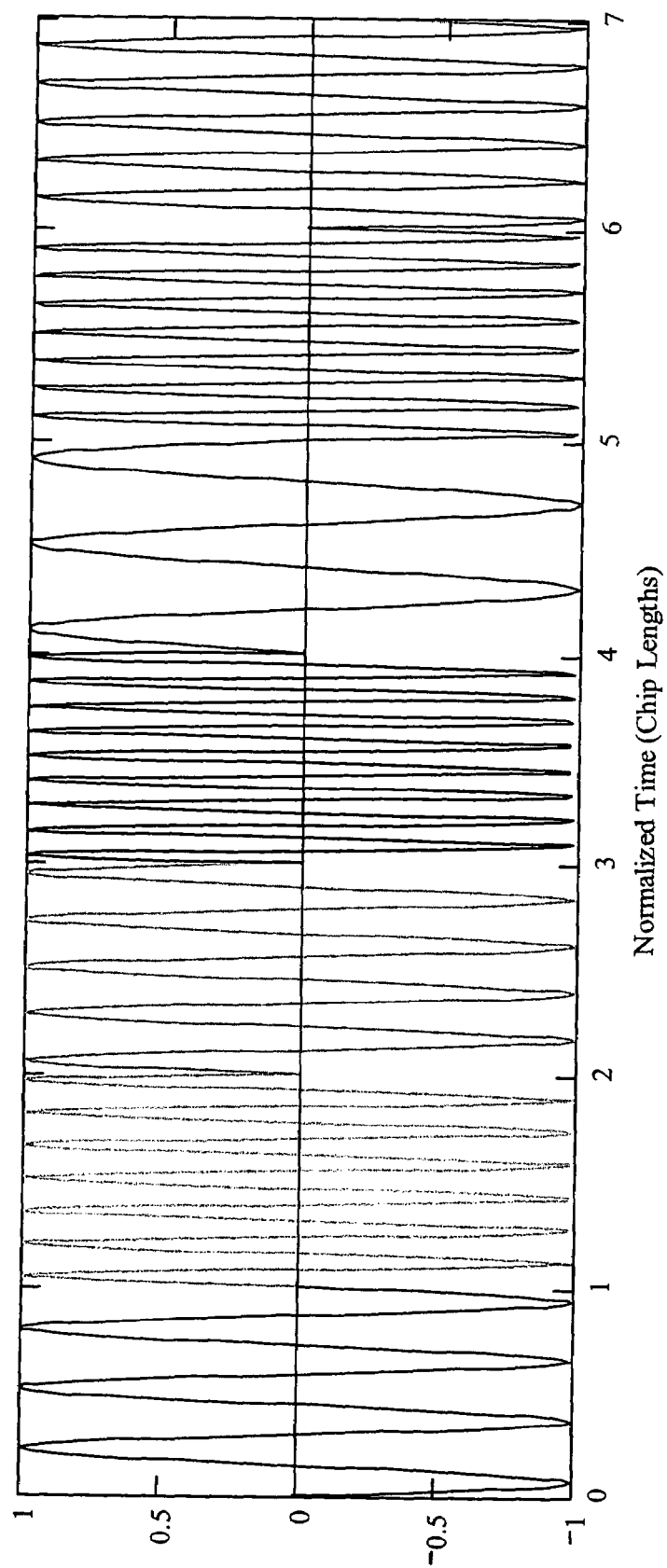
FIG. 3 is an example of a 7 chip OFC waveform based on the placement of chips.

The chip frequency response is shown in FIG. 2. These responses are a series of sampling functions with null bandwidths equal to $2 \cdot \tau^{-1}$. In addition, the sampling function center frequencies are separated by multiples of $\tau^{-1}$. Coding is accomplished by shuffling the chips to produce signal such as shown in FIG. 3, wherein the adjacent frequencies are not required to be sequential. The code is now determined by the order in which the orthogonal frequencies are used. Both signals occupy the same bandwidth and the coded information is contained within the signal phase. A more complete description of orthogonal frequency coding is found in D.C. Malocha, et al., "Orthogonal frequency coding for SAW device application," 2004 IEEE International Ultrasonics, Ferroelectrics, and Frequency Control $50^{th}$ Anniversary Joint Conference, in press, which is incorporated herein by reference.

In the example shown in FIG. 3, the seven local chip frequencies are contiguous in frequency but are not ordered sequentially in time and the chip weights are all unity. If the local chip frequencies were ordered high to low or low to high, the time sequence would be a stepped down-chirp and up-chirp, respectively. The start of the chip carrier frequency begins at zero amplitude, as seen in FIGS. 2 and 3, which is a condition of the orthogonality.

The OFC technique provides a wide bandwidth spread spectrum signal with all the inherent advantages obtained from the time-bandwidth product increase over the data bandwidth. The OFC concept allows for a wide bandwidth, chirp interrogation, frequency and binary coding per bit, a reduced compressed pulse width as compared to a PN sequence, and a secure code. The OFC technique of the present invention can be applied to ultra-wide-band applications since the fractional bandwidth can exceed 20% and can be used in a multi-tag or sensor environment by using proper coding techniques.

Figure 4:
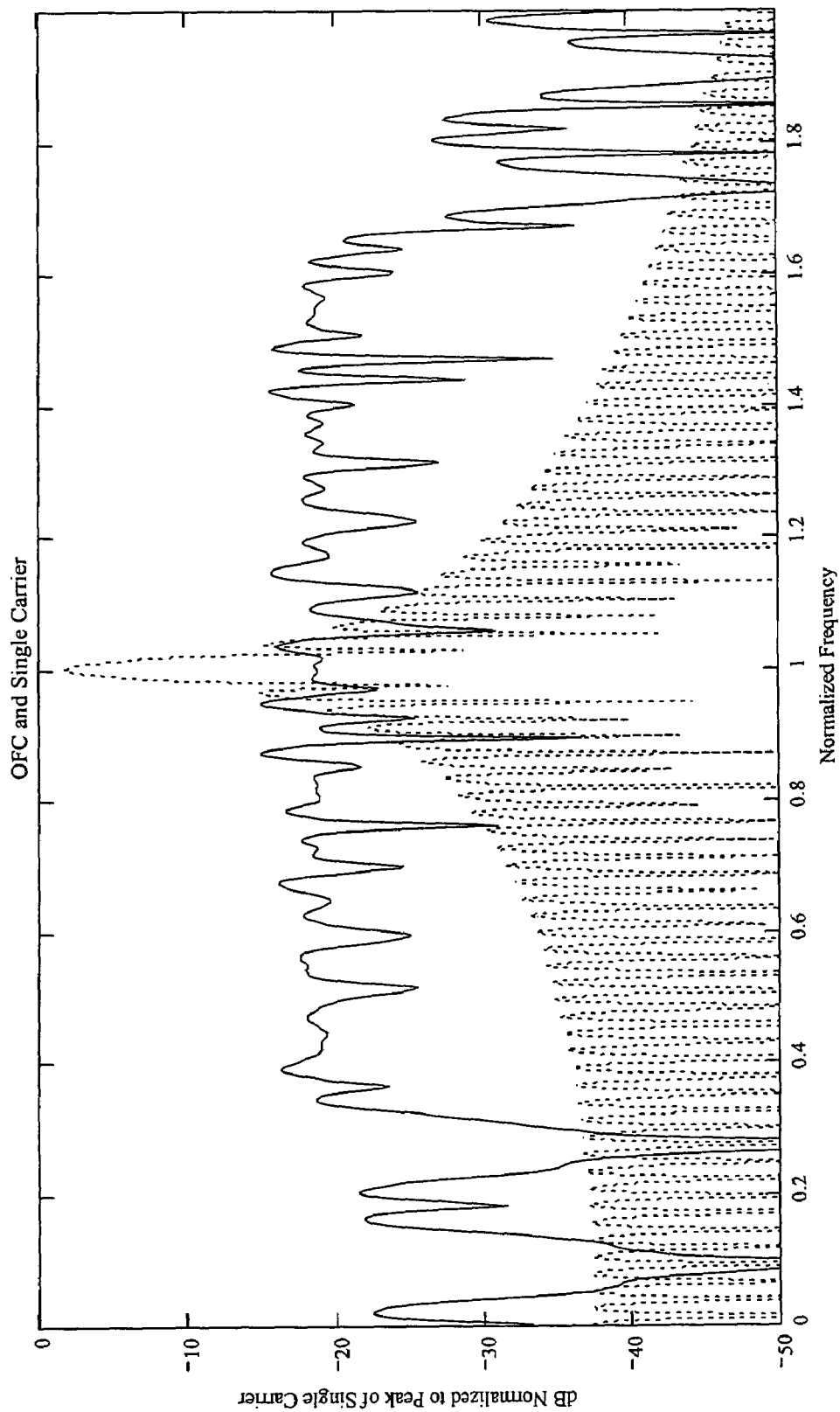
FIG. 4 is a frequency response of a 7 chip OFC device (solid line) and a single carrier (dashed line).
Figure 5:
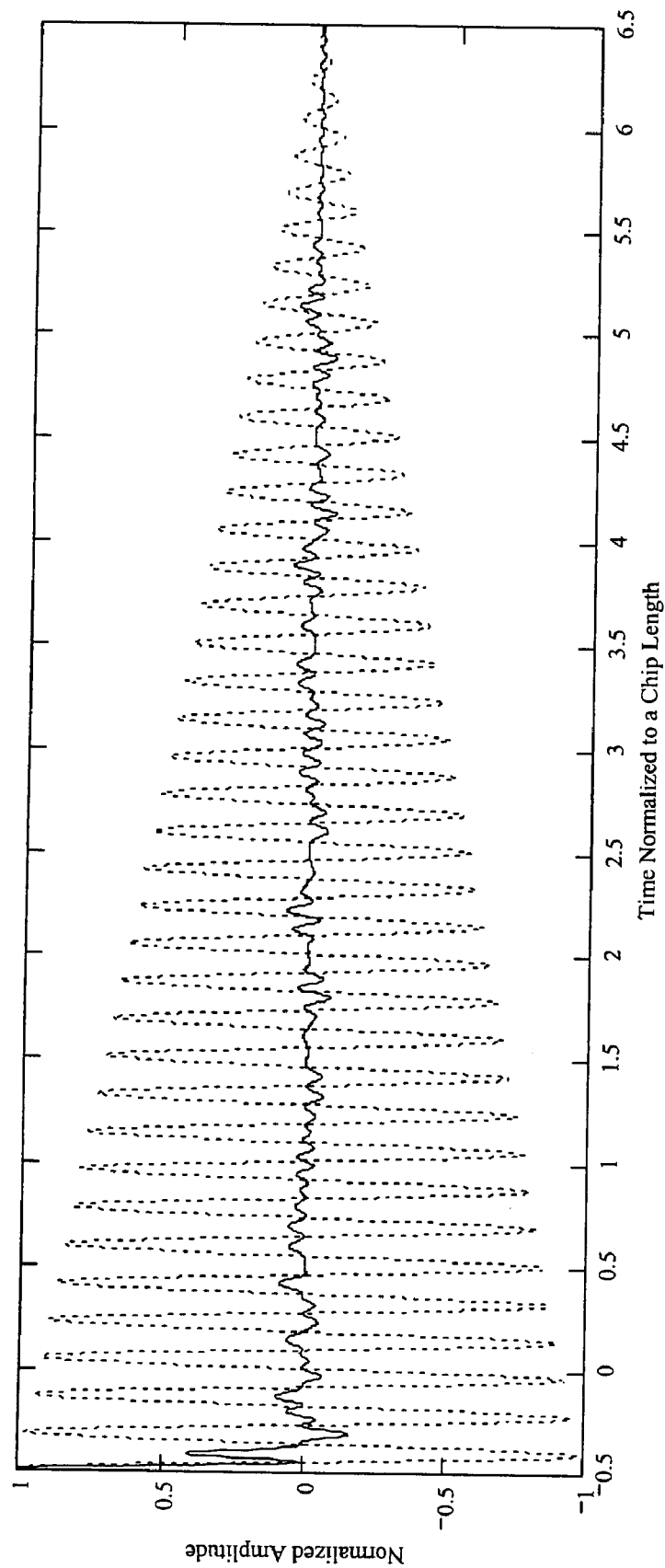
FIG. 5 shows the time autocorrelation (½ length) of a single carrier BPSK (dashed line) and a 7 chip OFC (solid line) signals having approximately the same time length.
Figure 6:
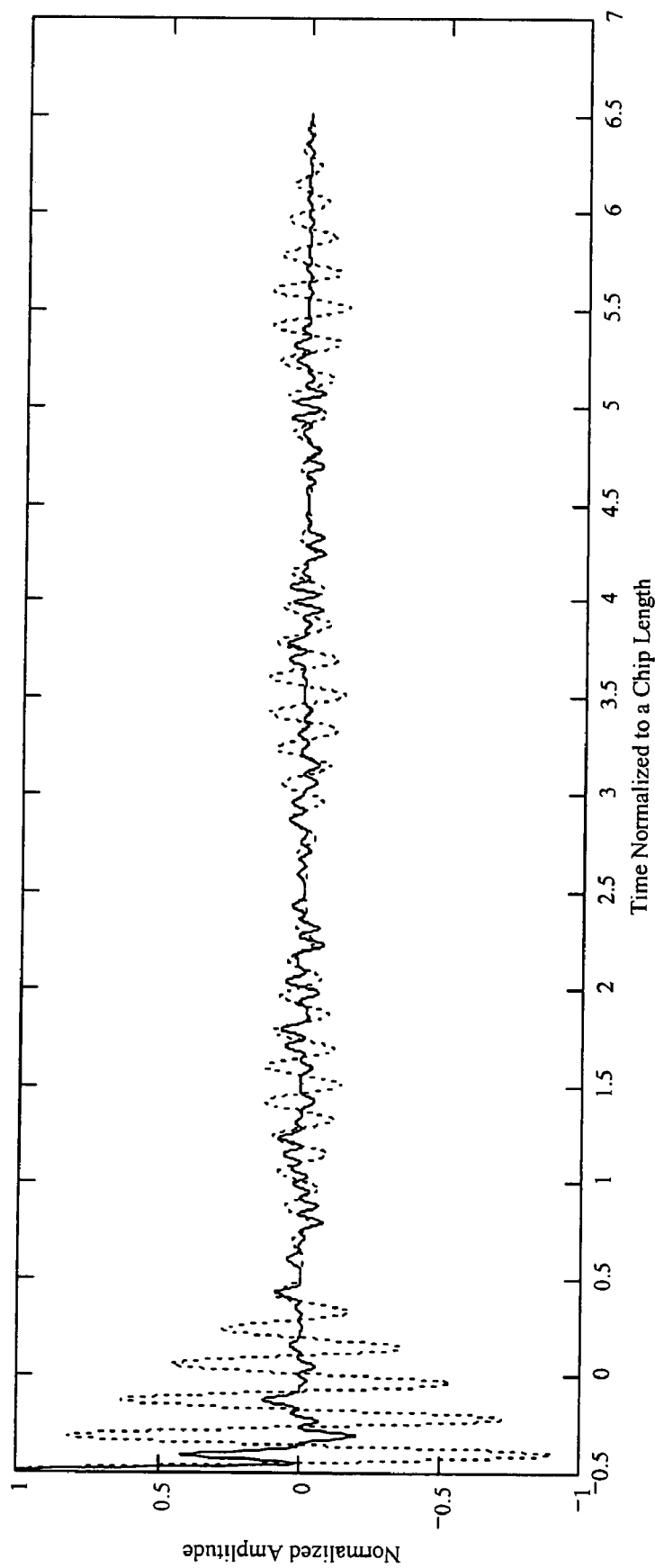
FIG. 6 shows the time autocorrelation (½ impulse length) of a single carrier PN code (dashed line) and a PN-OFC (solid line) signal having a 7 chip Barker code modulating the chips of both signals.
Figure 7:
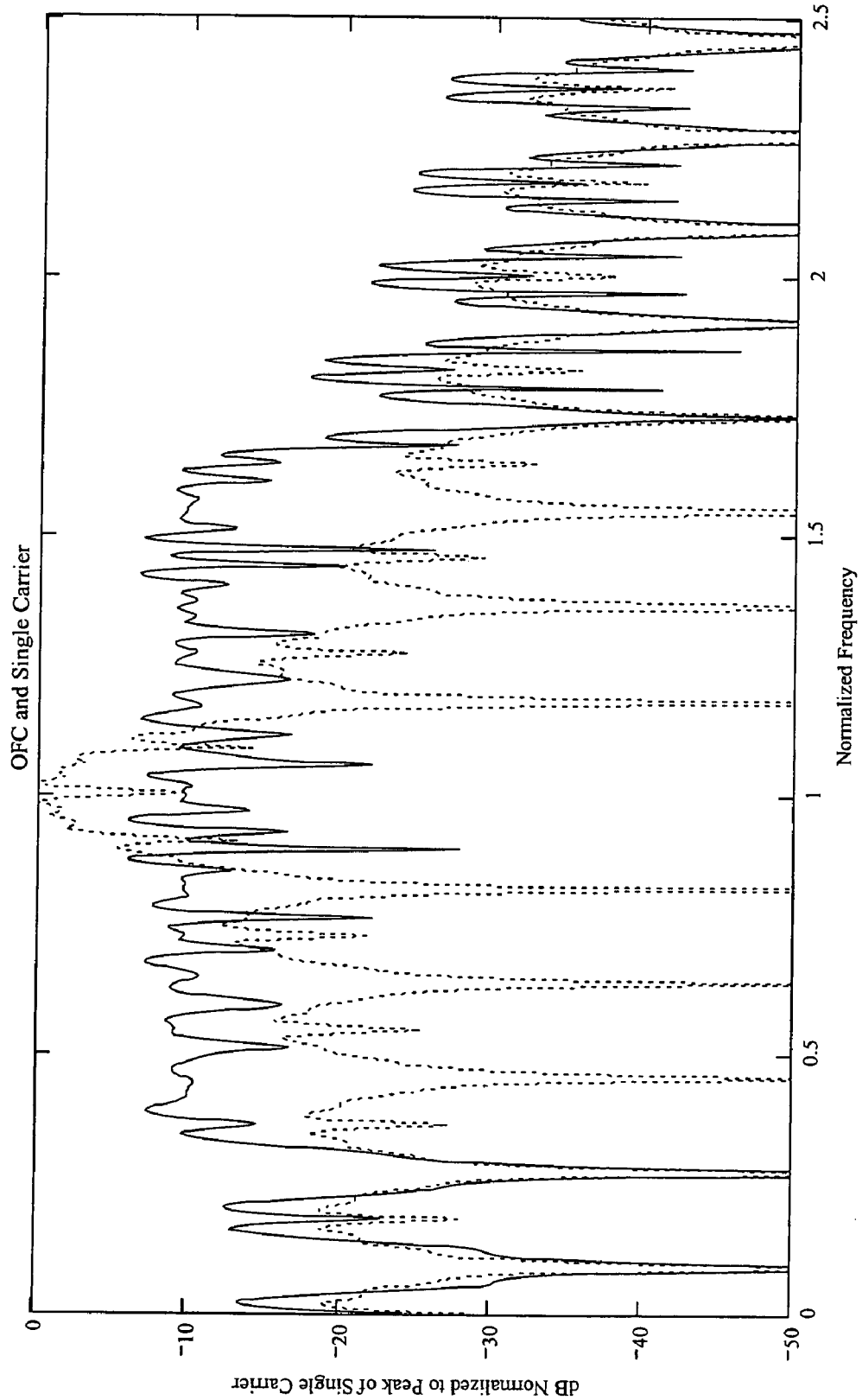
FIG. 7 shows the frequency response of a 7 chip PN-OFC signal (solid line) and a single carrier signal (dashed line).
Figure 8:
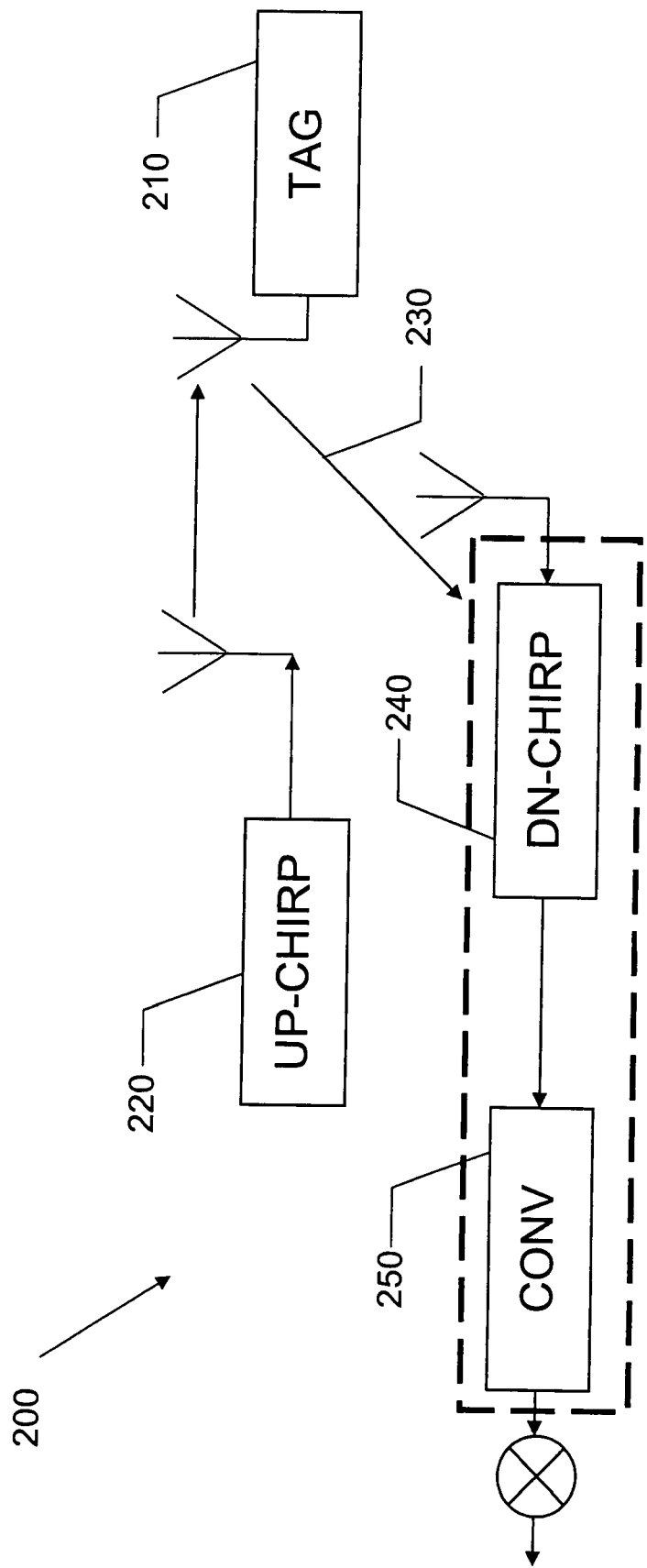
FIG. 8 is a block diagram of an example of an OFC SAW system according to the present invention.

The given chip sequence represents the OFC for the bit. When there are J-chips with J different frequencies in a bit, then there are J factorial possible permutations of the frequencies within the bit. A signal can be composed of multiple bits, with each bit having the same OFC or differing OFC. For the case of a signal, J-chips long and having a single carrier frequency, the signal is a simple gated RF burst $\tau_B$ long. The frequency responses of a 7 bit OFC is shown by the solid line and a single carrier signal is represented by a dashed line in FIG. 4, with both time functions normalized to unity and having identical impulse response lengths. The single carrier, shown as the dashed line, is narrowband and has approximately 17 dB greater amplitude at center frequency, as compared to the OFC (J=7), shown as a solid line, which has a much wider bandwidth. The time domain autocorrelation for the signals is shown in FIG. 5. The peak autocorrelation is exactly the same, but the OFC compressed pulse width is approximately $0.28 \cdot \tau_C$, as compared with the single carrier compressed pulse width of approximately a bit width, $\tau_B = 7 \cdot \tau_C$. This provides the measure of the processing gain (PG), which is the ratio of the compressed pulse width to the bit length, or in this case, PG=49.

Figure 9:
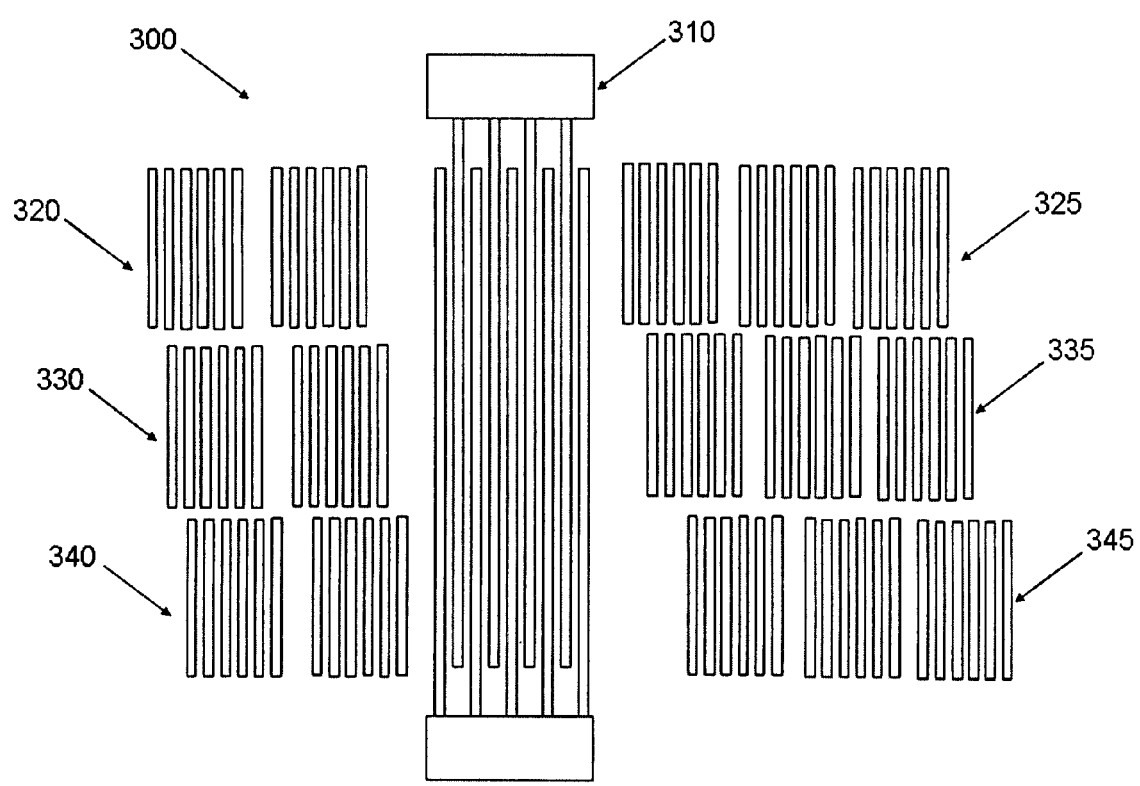
FIG. 9 is a schematic diagram of an example of an OFC SAW sensor implementation according to the present invention.

In the preferred embodiment, apparatus, systems, devices and methods of the present invention provides an orthogonal frequency coding technique for SAW sensors incorporating the use of multiple parallel acoustic tracks to provide increased coding by phase shifting and delaying a code sequence. FIG. 9 is a schematic of a surface acoustic wave sensor using parallel tracks with multiple reflectors with differing delay offsets to form a complex code sequence. The reflectors shown are schematically uniform, but alternatively could include fingers withdrawn, have reflector position modulation, differing frequencies or be spatially weighted.

As shown in FIG. 9, the surface acoustic wave device of the present invention includes a transducer 310 that is common with each parallel track. In the example shown, there are three parallel tracks. A track is composed of the center transducer 310 and a left reflector bank 320, 330, 340 and a right reflector bank 325, 335, 345. For example, one track is composed of the common center transducer 310, left reflector bank 320 and right reflector bank 325. Similarly, the second and third tracks include the common center transducer 310 and left reflector banks 330 and 340 and right reflectors banks 335 and 345, respectively.

In order to put more code information into the device, it is possible to put multiple tracks in parallel, but where there is a delay between the starting chip sequence in each track. The amplitude, phase and delay of each chip can be different from adjacent chips and the sum of all chips yields the code sequence in each track, and the sum of all parallel tracks yields the complete signal code sequence. In this matter, the device length increases by only one chip but the coding doubles. The cost is a slightly wider device, but the device width is typically very narrow.

As an example, if uniform weighted chip reflectors are used and the chips in one track are delayed by ½ chip and are in phase quadrature at center frequency, a binary phase shift key (BPSK) code is generated. As a second example, if cosine spatially weighted chip reflectors are used and the chips in one track are delayed by ½ chip and are in phase quadrature at center frequency, a minimum shift key (MSK) code is, generated. By changing the envelope of the chip response, any required pulse shape can be implemented within the reflectors.

While the invention has been described, disclosed, illustrated and shown in various terms of certain embodiments or modifications which it has presumed in practice, the scope of the invention is not intended to be, nor should it be deemed to be, limited thereby and such other modifications or embodiments as may be suggested by the teachings herein are particularly reserved especially as they fall within the breadth and scope of the claims here appended.

We claim:

1. An orthogonal frequency coded device comprising:
a substrate;
a transducer fabricated on said substrate; and
plural acoustic tracks each having a bank of orthogonal frequency reflectors, the plural acoustic tracks coupled with the transducer, each acoustic track producing a different orthogonal code sequence with a different delay between a starting chip sequence in each of the different code sequences, the sum of the different code sequences forming an orthogonal coded signal having plural contiguous stepped orthogonal frequencies within a bandwidth for the device, wherein the plural acoustic tracks provide increased coding by including delays in the code sequences.

2. The device of claim 1, wherein each bank of reflectors comprises:
a first and second bank of reflectors located on opposite sides of said transducer, the first and second banks coupled with the transducer.

3. The device of claim 2, wherein each of the first and second bank of reflectors comprises:
plural reflectors coupled together each producing an orthogonal frequency within a bandwidth to generate the code sequence for a corresponding one of the plural tracks, wherein a summation of the codes sequences from the plural tracks produces the orthogonal coded signal for the device.

4. The device of claim 1, wherein the plural acoustic tracks comprises:
plural uniform parallel acoustic tracks.

5. The device of claim 1, wherein each of the different code sequences comprises:
a different group of plural orthogonal contiguous frequencies that are contiguous in time and are not sequential in frequency.

6. The device of claim 1, wherein each one of the plural parallel acoustic tracks includes:
reflector position modulation.

7. The device of claim 1, wherein each one of the bank of reflectors comprises:
plural spatially weighted reflectors.

8. The device of claim 1, wherein the delay of each of the parallel tracks comprises:
a code sequence phase shift that is different from adjacent acoustic track and the sum of all different code sequences is the orthogonal coded signal of the device for increased coding by phase shifting and delaying the code sequences.

9. The device of claim 1, wherein the code sequence of each of the parallel tracks includes:
a different amplitude for each code sequence that is different from adjacent code sequences and the sum of all code sequences yields the orthogonal coded signal of the device.

10. The device of claim 1, wherein each bank of reflectors are uniform weighted chip reflectors and the chips in one acoustic track are delayed by ½ chip and are in phase quadrature at center frequency to generate a binary phase shift key (BPSK) code.

11. The device of claim 1, wherein each bank of reflectors are cosine spatially weighted chip reflectors and the chips in one acoustic track are delayed by ½ chip and are in phase quadrature at center frequency to generate a minimum shift key (MSK) code.

12. The device of claim 1, wherein the orthogonal coded device is a surface acoustic wave sensor.

13. The device of claim 1, wherein the orthogonal frequency coded device is a silicon sensor.

14. A method for producing an orthogonal frequency coded device comprising the steps of:
providing a substrate;
fabricating a transducer on said substrate;
fabricating plural parallel acoustic tracks each having a bank of orthogonal frequency reflectors on the substrate, each of the reflectors in the bank of reflectors producing a different orthogonal frequency in a bandwidth;
summing the different orthogonal frequencies to form a different orthogonal code sequence having plural contiguous stepped orthogonal frequencies within the bandwidth for the track;
coupling each of the plural acoustic tracks with the transducer;
delaying the a starting chip sequence in each track; and
summing the different orthogonal code sequences from the plural tracks to produce an orthogonal code signal for the device, wherein the plural acoustic tracks provide increased coding by delaying the code sequences.

15. The method of claim 14, wherein fabricating each plural parallel acoustic track comprises the step of:
fabricating a first and second bank of reflectors on opposite sides of the transducer, the first and second bank of reflectors coupled with the transducer.

16. The method of claim 15, wherein fabricating each of the first and second bank of reflectors comprises the steps of:
fabricating plural adjacent reflectors, each producing a different one of a contiguous orthogonal frequency within a bandwidth;
coupling the plural reflectors together; and
summing the different orthogonal frequencies from the plural adjacent reflectors from the first and second bank of reflectors to produce the code sequence for the acoustic track.

17. The method of claim 16, further comprising the step of:
phase shifting the different orthogonal frequencies to increase coding.

18. The method of claim 16, further comprising the step of:
delaying the different orthogonal frequency from adjacent reflectors, wherein the sum of the different orthogonal frequencies from adjacent reflectors yields the code sequence for the corresponding track.

* * * * *